Feb. 5, 1952 G. W. FYLER ET AL 2,584,120

TUNER

Filed Dec. 20, 1948 2 SHEETS—SHEET 1

INVENTORS.
George W. Fyler,
BY Raymond R. Wingert,
Foorman L. Mueller
Atty.

Feb. 5, 1952

G. W. FYLER ET AL 2,584,120

TUNER

Filed Dec. 20, 1948

2 SHEETS—SHEET 2

INVENTORS.
George W. Fyler
BY Raymond R. Wingert,
Forman L. Mueller
Atty.

Patented Feb. 5, 1952 2,584,120

UNITED STATES PATENT OFFICE 2,584,120

TUNER

George W. Fyler, Lombard, and Raymond R. Wingert, Chicago, Ill., assignors to Motorola, Inc., Chicago, Ill., a corporation of Illinois Application December 20, 1948, Serial No. 66,164

8 Claims. (Cl. 250—40)

This invention relates to step tuners of the type which may be used in television receivers, for example.

Tuners of this type commonly include a rotary step switch having positions respectively corresponding to the various frequency channels or stations that may be received by the set. In each of its positions, the switch serves to render effective certain tuning elements, such as inductors, which are adjusted for the reception of signals in that particular channel. While every effort is made to adjust the tuning elements as accurately as possible before the receiver is placed in service, there are apt to be slight errors in the settings of these elements due to various causes. It is desirable, therefore, that provision be made for some auxiliary fine tuning in each of the channels to compensate for possible errors in the adjustments of the main tuning elements. Also, by a slight change of the tuning of the circuits it may be possible to eliminate an unwanted signal which interferes with the signal being received. Obviously, however, it would not be practical to equip each channel with an individual vernier for this purpose; hence, whatever vernier means is employed should be common to all channels and at the same time introduce a minimum of stray reactances into the various channels.

An object of the invention is to provide an improved fine tuning or vernier arrangement for a television tuner or the like which does not introduce any appreciable stray reactances into the various channels.

A further object is to provide an improved rotary step tuner and associated vernier unit having concentric controls whereby convenient operation and compact construction are afforded.

A still further object is to provide a novel television tuner as described above, wherein a trimmer capacitor is made a part of the rotary switch structure as a means of reducing the cost of the combination.

The invention features a coaxial shaft assembly in which the outer shaft is employed to manipulate a rotary element of the step switch, and the inner shaft actuates a rotary plate of a trimmer capacitor. The trimmer capacitor has a fixed plate which is located in proximity to a rotary element of the switch. This fixed plate is electrically connected to the rotary switch element through a direct path which has no appreciable inductance or resistance. As the switch is turned to tune in various stations, it places the trimmer successively in circuit with the tuning elements in the respective channels.

The foregoing and other objects, features and advantages of the invention may be more thoroughly understood from the following description taken in connection with the accompanying drawing, wherein.

Figure 1:
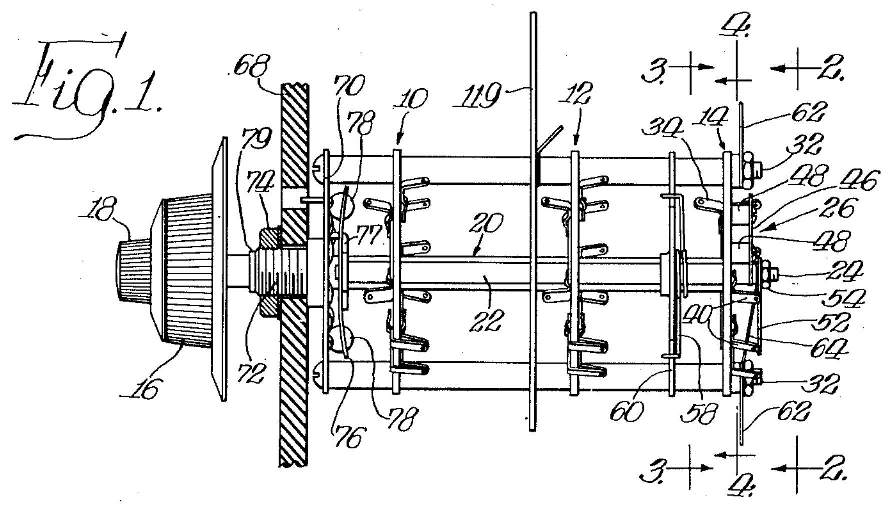
Fig. 1 is a side elevational view of a tuner constructed in accordance with and embodying the invention.
Figure 2:
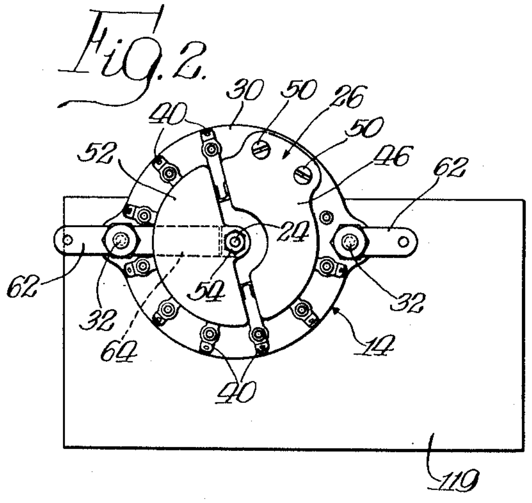
Fig. 2 is an end view of the tuner taken on the line 2—2 in Fig. 1, showing the trimmer capacitor in elevation.
Figure 3:
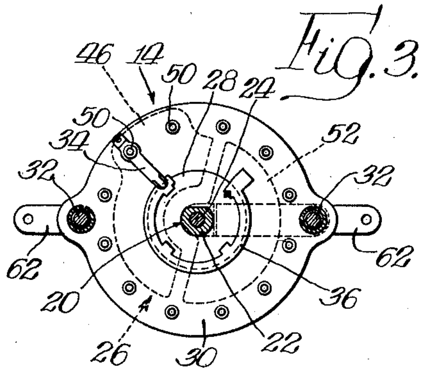
Figures 4, 5:
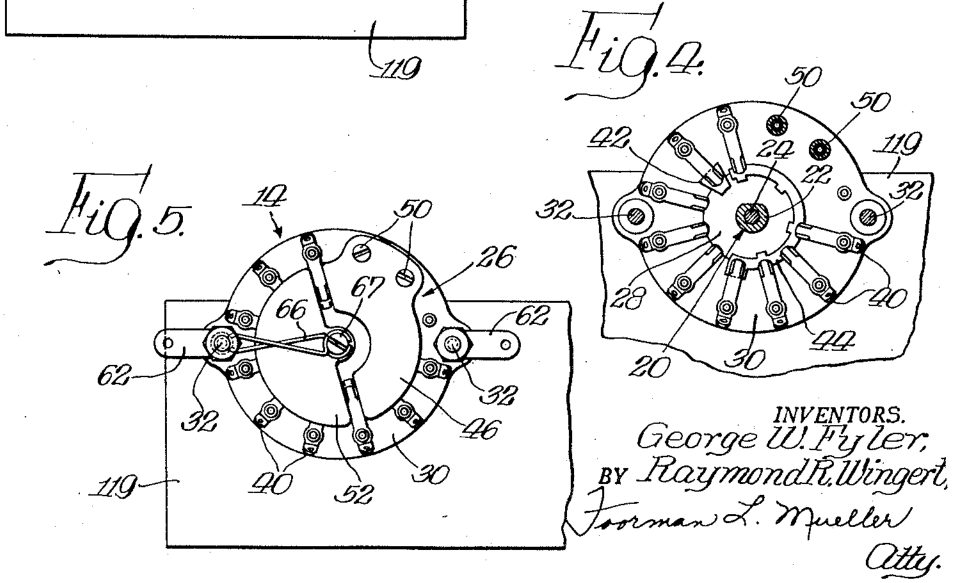
Figures 6, 7, 8:
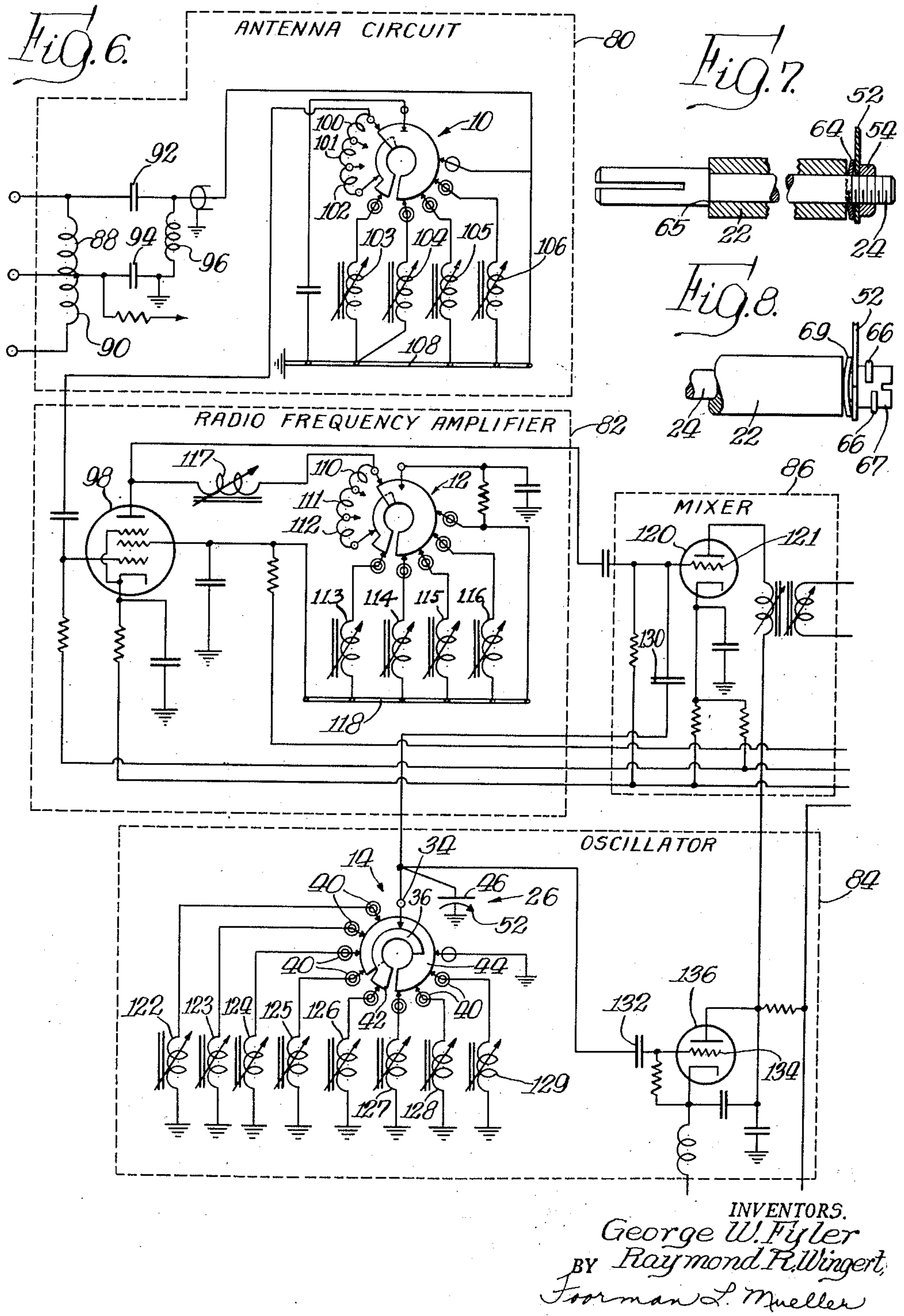

Figs. 3 and 4 are cross-sectional views on the lines 3—3 and 4—4, respectively, in Fig. 1, showing opposite sides of the switch member associated with the trimmer;

Fig. 5 is a view similar to Fig. 2 illustrating a modification of the invention;

Fig. 6 is a circuit diagram of the tuner and associated components of a television receiver;

Fig. 7 is a fragmentary longitudinal section through the ends of the shaft assembly of the embodiment shown in Fig. 1; and Fig. 8 is a fragmentary side view of an end of the shaft assembly and associated parts of the embodiment shown in Fig. 5.

In practicing the invention, a coaxial shaft assembly is employed in the tuner, the outer shaft serving to actuate the rotary parts of the switch mechanism while the inner shaft actuates the rotary plate of the trimmer capacitor. The trimmer is located in proximity to that portion of the switch structure which controls the oscillator circuit of the receiver. A rotary contact member of this switch is electrically connected by a stationary wiper contact to the fixed plate of the trimmer. The rotary plate of the trimmer is grounded through the coaxial shaft assembly to the frame of the tuner. Concentric control knobs are provided on the shaft assembly. As the outer knob is turned, the tuner is switched from one station to another. The switch also serves to place the trimmer in circuit with the selected oscillator coil or inductor. The inner knob controls for positioning of the movable trimmer plate for vernier adjustment of the tuning in each particular channel. A suitable form of frictional detent or braking means is utilized to prevent unwanted movement of the trimmer plate, there being two embodiments of this means disclosed herein.

In the tuner shown in Fig. 1, there are three different switch sections 10, 12 and 14, which respectively pertain to the antenna circuit, radio frequency amplifier, and oscillator sections of the television receiver. The movable portions of all of these switch sections are actuated in unison by the outer knob 16 of a pair of concentric control knobs 16 and 18. These knobs 16 and 18 are mounted on a coaxial shaft assembly 20 consisting of an outer shaft 22 and an inner shaft 24 which are independently rotatable. The knob 16 is secured to the outer shaft 22, and the inner knob 18 is secured to the inner shaft 24 which actuates the rotary plate of the oscillator trimmer capacitor generally designated 26, Figs. 1 and 2. The construction of the trimmer 26 will be described in greater detail presently.

The switch sections 10, 12 and 14 of the tuner are of the well known wafer type in which stationary contacts mounted on insulating discs or wafers are arranged to have wiping engagement with annular or arcuate conducting members secured on rotatable insulating discs that are fastened to the outer shaft 22. For example, referring to Fig. 3, the oscillator switch section 14 comprises a central insulating disc or wafer 28 on the shaft 22, and an outer insulating ring or wafer 30 which is mounted in fixed position on the studs or posts 32 of the tuner. A single stationary wiper contact 34 is mounted on the front face of the ring 30, and cooperates with a conducting segment 36 on the movable disc 28, with which it is constantly engaged.

On the rear face of the stationary insulating ring or disc 30 are mounted several stationary contacts 40, Fig. 4, which are arranged circumferentially about the inner movable disc 28. These contacts 40 may cooperate with a single movable contact 42, or with a conducting segment 44, both of which are mounted on the disc 28. The movable contact 42 has a permanent electrical connection with the segment 36, Fig. 3, on the front side of the disc 28. The segments 36 and 44, however, are insulated from each other.

The trimmer capacitor 26, Figs. 1 and 2, includes a fixed plate 46 having an approximately semicircular shape, which plate is mounted on spacers 48 and is secured by rivets or screws 50 to the rear face of the insulating ring 30 in parallel relation thereto. Spacers 48 may be predetermined in length to give the desired variation in capacity. Spaced axially from the fixed plate 46 is a rotatable plate 52, also having an approximately semicircular shape, which is secured by a nut 54 to a threaded end portion of the inner shaft 24. The plate 52 is free to rotate with the shaft 24 throughout a complete revolution, being actuated by the knob 18. As the plate 52 is rotated, it causes the capacitance of the trimmer 26 to vary. In Fig. 2, the plate 52 occupies the position wherein the capacitance of the trimmer 26 is at its minimum value.

The stationary contact 34, Fig. 3, is secured to the insulating ring 30 by one of the fasteners 50 which mounts the stationary trimmer plate 46 on this ring, thereby affording a direct electrical connection of negligible impedance between the contact 34 and plate 46. The contact 34 in turn is electrically connected (through the medium of the segment 36, Fig. 3) to the movable lug or contact 42, Fig. 4, on the other side of the rotatable disc 28. It is apparent, therefore, that the fixed capacitor plate 46 will be electrically connected to a selected one of the stationary contacts 40 depending upon the position of the switch 14, that is to say, the position of the control knob 16.

The rotatable capacitor plate 52, as mentioned above, is secured to the inner shaft 24. If desired, stops (not shown) can be provided to limit the extent to which the plate 52 can be rotated. The shaft assembly 20 is grounded through a spring 58 and a metal strip 60 to the posts 32 which are included in the frame of the switch mechanism. Soldering lugs 62 are provided on the posts 32 for grounding the switch frame to the chassis of the receiver. To prevent excessive play or looseness of the trimmer plate 52, a braking means is provided. In the embodiment shown in Figs. 1 and 2, this braking means consists of a resilient strip or leaf spring 64 secured at one end to a post 32. The other end of the strip 64 extends to the center of the switch assembly and has an aperture through which the inner shaft 24 projects. This inner end of the strip 64 bears against the front face of the capacitor plate 52 near the center thereof and affords sufficient friction so that the plate 52 tends to maintain the position to which it is set. As shown more clearly in Fig. 7, the inner end of the leaf spring 64 is cupped and bears against the rear end of the outer shaft 22 as well as against the plate 52 when the nut 54 is tightened. The front end of the inner shaft 24 protrudes from the outer shaft 22 and has a shoulder 65 which is urged against the end of shaft 22 by the resiliency of the cupped spring 64. Thus, the inner shaft 24 is held against axial movement relative to the outer shaft 22.

An alternative form of braking means is shown in Figs. 5 and 8. It consists of a looped spring wire 66 which is anchored to post 32. Free ends of the wire 66 engage a round nut or small drum 67 on the rear end of the shaft 24 in scissors fashion, thereby exerting a slight frictional drag thereon. This is sufficient to prevent the shaft from turning due to vibration or other minor disturbances. It may be preferred also to use a cupped washer 69, Fig. 8, between the rear end of shaft 22 and the capacitor plate 52 for taking up the play, if any, between these parts.

The switch mechanism is mounted on a supporting panel 68, Fig. 1, in any suitable manner. As shown, a plate 70 near the front end of the mechanism is secured to a threaded bushing 72 concentric with the shaft assembly 20, which bushing extends through a suitable aperture in the panel 68 and receives a mounting nut 74 thereon. The outer shaft 22 is held in its adjusted rotary position by a detent which, in the present instance, comprises a resilient jockey disc 76 carrying rollers 78 that cooperate with circularly arranged protuberances on the plate 70. The disc 76 also exerts tension upon an arm 77 secured to the outer shaft 22, placing the shaft 22 under axial tension which is resisted by a ring clip 79 on the shaft 22 bearing against the end of the bushing 72. In this way the shaft 22 is held against axial movement relative to the switch frame.

Referring now to Fig. 6, the components of the television receiver which are associated with the tuner include the antenna circuit 80 controlled by the switch section 10, the radio frequency amplifier 82 controlled by the switch section 12, the oscillator 84 controlled by the switch section 14, and the mixer 86 which combines the outputs of the radio frequency amplifier 82 and the oscillator 84. The output of the mixer 86 is fed to the first intermediate frequency stage (not shown) of the receiver, in the usual fashion.

The antenna circuit 80 has input coils 88 and 90 for matching the circuit 80 to a 75-ohm or a 300-ohm line, as the case may be. In connection with these input coils there are provided capacitors 92 and 94 and a coil 96 (optional), which together constitute an input filter primarily for rejecting input signals of intermediate frequency. The antenna circuit 80 includes tuning elements for selecting the incoming signals, which then are passed to the amplifier tube 98 in the radio frequency amplifier 82. These tuning elements include various coils 100 to 106, inclusive, and a bus bar 108 having a predetermined amount of inductance per unit of length. The switch section 10, which is similar in construction to the switch section 14 described above, determines the manner in which these tuning elements are connected together for receiving signals in the various frequency channels. The details of this tuning arrangement are of only incidental interest so far as the present invention is concerned, and the drawing illustrates this arrangement with sufficient clarity to indicate its mode of operation to persons skilled in the art.

Signals which pass through the antenna circuit 80 are fed to the input grid of the amplifier tube 98. On the output side of the tube 98 there is another tuning arrangement which includes the tuning inductors 110 to 117, inclusive, and the bus bar 118 having a given inductance per unit of length. Here again, the precise construction of this tuning arrangement is not pertinent to the present invention. To prevent unwanted feedback between the amplifier 82 and antenna circuit 80, an electromagnetic barrier or shield plate 119 (Figs. 1 and 2) is mounted on the switch structure intermediate the switch sections 10 and 12. After being amplified in the amplifier 82, the radio frequency signal is fed to the input grid 121 of a mixer tube 120 in the mixer stage 86, where it is heterodyned with a local signal supplied by the oscillator 84. The resulting intermediate frequency signal is amplified by the tube 120 and passed to the first intermediate frequency stage of the receiver.

In the oscillator circuit 84 there are several variable, magnetic-core inductors 122 to 129, inclusive, which are selected for operation through the medium of the switch section 14 for determining the resonant frequency of the oscillator 84. The stationary contact 34, Figs. 1, 3 and 6, of the switch 14 is electrically connected to the fixed plate 46 of the trimmer capacitor 26, and is also coupled by the capacitors 130 and 132, respectively, to the grid 121 of the mixer tube 120 and to the grid 134 of the oscillator tube 136. This contact 34, as mentioned previously, has wiping engagement with the rotatable switch segment 36 that is electrically connected to the contact lug 42 which successively engages the stationary contacts 40 as the switch is rotated. In the position of the switch which is illustrated in Fig. 6, the oscillator coil 126 is in circuit with the contact 34. The remaining oscillator coils 122 to 125, 127, 128 and 129 are grounded by the switch segment 44. For each setting of the switch 14, one oscillator coil is selected for operation and the remaining coils are grounded.

The selected oscillator coil (such as 126 in the present instance), resonates with the total circuit capacitance including the stray circuit capacity, input capacitances of the oscillator tube 136 and the mixer tube 120 and the trimmer capacitor 26. The coils 122 to 129 are respectively allocated to the various television channels or bands as follows:

| Coil | Channel Nos. |
|---|---|
| 129 | 2–3 |
| 128 | 4 |
| 127 | 5 |
| 126 | 6 |
| 125 | 7 |
| 124 | 8–9 |
| 123 | 10–11 |
| 122 | 12–13 |

In the case of those coils, such as 122, which are allocated to two channels, the inductance of the coil is chosen so that it will be optimum for the frequencies of these two channels. It is understood, of course, that only one of such a pair of channels is active in any given television area.

The trimmer 26 may be adjusted for each new setting of the switch 14 to compensate for any small error that may exist in the adjustment of an individual oscillator coil, such as 126. The trimmer 26 is common to all of the frequency channels, being automatically placed in circuit with the appropriate oscillator coil by the switch 14. As can be seen from the drawings, the trimmer 26 is inconspicuously small, is easily manipulated as an adjunct to the main tuning control, and it introduces no appreciable stray inductance or resistance into the oscillator circuit. It greatly increases the accuracy of reception while adding only a negligible amount to the cost of the tuner. Also, greatly improved reception results from the ability to tune out interfering signals.

While the invention has been illustrated and described with reference to what are considered to be the preferred embodiments thereof, it should be understood that modifications of such embodiments can be effected within the full intended scope of the invention as set forth in the appended claims.

We claim:

1. In a television tuner having a plurality of main tuning elements respectively allocated to various frequency channels, a channel-selecting switch having a rotatable contact surrounded by a stationary insulating ring, a stationary wiper contact mounted on said ring and engaging said rotatable contact, a stationary capacitor plate mounted on said ring and having a direct electrical connection of negligible impedance to said wiper contact, a rotatable capacitor plate disposed in proximity to said stationary capacitor plate, a plurality of stationary contacts on said ring each constituting a terminal of a main tuning element and being selectively engaged by said rotatable contact in accordance with the setting of said switch, conductive means for electrically connecting the other terminal of each main tuning element to said rotatable capacitor plate and means for rotating said rotatable capacitor plate, both of said plates constituting a trimmer capacitor having a capacitance which varies as said rotatable plate is moved relative to said stationary plate, thereby to place a variable amount of capacitance in circuit with the main tuning element in any selected frequency channel corresponding to the position of said rotary switch member.

2. In combination, a band switching device having wafer switches with stationary contacts and movable contacts and a shaft for actuating the movable contacts, a stationary capacitor plate mounted on one of said wafer switches and electrically connected to at least one stationary contact of said wafer switch, a rotary capacitor plate disposed with its center of rotation on the axis of said shaft, and an operating member for rotating said rotary capacitor plate.

3. Channel-selecting and vernier tuning apparatus for a television tuner which has a plurality of tuning devices respectively allocated to the various frequency channels, such apparatus comprising a variable capacitor having a pair of relatively movable plates, a channel-selecting switch for placing the various tuning devices selectively in operation according to the position of said switch, said switch having a movable contact member cooperating selectively with a plurality of stationary contacts each constituting one terminal of a tuning device, conductive means for electrically connecting the other terminal of each tuning device to the first plate of said capacitor, and conductive means for electrically connecting said movable contact member to the second plate of said capacitor, with the capacitance defined by said two capacitor plates determining the exact resonant frequency of the tuner for each setting of the switch throughout the several channels.

4. In a television tuner having a plurality of tuning devices respectively allocated to various frequency channels, the combination of a channel-selecting switch having a rotatable contact member cooperating selectively with a plurality of stationary contacts mounted on a stationary insulating ring, a variable capacitor including a stationary plate and a rotatable plate, means supporting said stationary plate on said insulating ring, conductive means for electrically connecting one of said capacitor plates to said rotatable contact member, other conductive means for electrically connecting the other of said capacitor plates to a common terminal of the main tuning elements, with said plurality of stationary contacts being connected respectivley to the other terminals of the main tuning elements, said switch placing said tuning elements in operation selectively depending upon the position of said switch, and means for turning said rotatable capacitor plate to vary the amount of capacitance in circuit with any tuning element selected by said switch, thereby determining the exact resonant frequency thereof.

5. In a television tuner having a plurality of main tuning elements respectively allocated to various frequency channels, the combination of a rotary step switch having a rotatable contact member cooperating selectively with a plurality of stationary contacts mounted on a stationary insulating ring, a coaxial shaft assembly having an outer shaft connected to said rotatable contact member and having an inner shaft rotatable independently of said outer shaft, a trimmer capacitor including a stationary plate supported on said insulating ring and a rotatable plate mounted on said inner shaft, conductive means for electrically connecting one of said capacitor plates to said rotatable contact member, other conductive means for electrically connecting the other of said capacitor plates to a common terminal of the main tuning elements, and still other conductive means electrically connecting said plurality of stationary contacts respectively to the other terminals of the main tuning elements to place said capacitor selectively in circuit with any of the main tuning elements in accordance with the setting of said switch, thereby to determine the exact resonant frequency of the selected tuning device.

6. Channel-selecting and vernier tuning apparatus for a television tuner which includes a plurality of main tuning portions for tuning to various frequency channels, said apparatus including in combination, a coaxial shaft assembly including an outer shaft and an inner shaft rotatable independently of said outer shaft, rotary switch means including a plurality of spaced stationary contacts, and rotatable contact means cooperating selectively with said fixed contacts, electrical means connecting said main tuning portions to said stationary contacts, mechanical means connecting said rotatable contact means to said outer shaft for rotation therewith to selectively connect said tuning portions, a trimmer capacitor including a stationary capacitor plate and a rotatable capacitor plate, means providing electrical connection between said stationary capacitor plate and one of said stationary contacts of said switch to connect said capacitor in circuit with the connected tuning portions, mechanical means connecting said rotatable capacitor plate to said inner shaft for rotation thereby to determine the exact frequency of the connected tuning portions, and friction means operatively connected to said rotatable capacitor plate for exerting constant braking action thereon.

7. The combination set forth in claim 6, wherein said friction means comprises spring means bearing against said rotatable capacitor plate.

8. The combination as set forth in claim 6, wherein said friction means comprises a member rotatable with said inner shaft and spring means bearing against said member.

GEORGE W. FYLER.
RAYMOND R. WINGERT.

REFERENCES CITED

The following references are of record in the file of this patent:

UNITED STATES PATENTS

| Number | Name | Date |
|---|---|---|
| 1,633,870 | Potter | June 28, 1927 |
| 1,737,277 | Tuska | Nov. 26, 1929 |
| 2,135,841 | Polydoroff et al. | Nov. 8, 1938 |